(12) United States Patent
Joly et al.

(10) Patent No.: US 6,345,378 B1
(45) Date of Patent: Feb. 5, 2002

(54) SYNTHESIS SHELL GENERATION AND USE IN ASIC DESIGN

(75) Inventors: Christian Joly, Palo Alto; Zarir Sarkari, San Jose; Ravichandran Ramachandran, Sunnyvale; Sarika Agrawal, Santa Clara; Sanjay Adkar, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 08/409,191

(22) Filed: Mar. 23, 1995

(51) Int. Cl.[7] .............................................. G06F 17/50
(52) U.S. Cl. .............................................. 716/2; 716/3
(58) Field of Search ................................. 364/488, 489, 364/490, 491, 578; 716/2, 3, 6, 10, 12, 18

(56) References Cited

U.S. PATENT DOCUMENTS

| | | | | | |
|---|---|---|---|---|---|
| T943,001 I4 | * | 2/1976 | Mennone | ..................... | 364/300 |
| T944,001 I4 | * | 3/1976 | Hanan et al. | ................ | 364/300 |
| 4,027,246 A | * | 5/1977 | Caccoma et al. | ........... | 700/121 |
| 4,263,651 A | * | 4/1981 | Donath et al. | ................... | 716/6 |
| 4,703,435 A | * | 10/1987 | Darringer et al. | .............. | 716/18 |
| 4,882,690 A | * | 11/1989 | Shinsha et al. | ................ | 716/18 |
| 4,916,627 A | * | 4/1990 | Hathaway | ....................... | 716/6 |
| 5,029,102 A | * | 7/1991 | Drumm et al. | ................ | 716/18 |
| 5,220,512 A | * | 6/1993 | Watkins et al. | ................ | 716/11 |
| 5,222,030 A | * | 6/1993 | Dangelo et al. | ............... | 716/11 |
| 5,362,463 A | * | 11/1994 | Donath et al. | ........... | 423/239.1 |
| 5,392,221 A | * | 2/1995 | Donath et al. | ................ | 716/16 |
| 5,644,498 A | * | 7/1997 | Joly et al. | ....................... | 716/2 |
| 5,956,257 A | * | 9/1999 | Ginetti et al. | ................... | 716/3 |

\* cited by examiner

*Primary Examiner*—Matthew Smith
*Assistant Examiner*—Vuthe Siek

(57) ABSTRACT

A practical approach for synthesis for million gate ASICs is based on the use of synthesis shells. The synthesis shell is generated by beginning with a gate level description of a fully characterized and optimized block. This gate level description is reduced by removing internal gates to produce a synthesis shell of the synthesized block. The synthesis shell preserves input load and fanout for the block, output delay relative to clock for the block, setup/hold constraints on input signals relative to the clock for the block, and delay from input to output for pass through signals for the block. Such a synthesis shell can be used as a substitute for original design netlists and can be used for hierarchical synthesis in a customer's design environment, or as a deliverable from a provider of ASIC services in order to protect the intellectual property of such a provider. Since all the information that is needed by a synthesizer is available in the synthesis shell in netlist form, the shell is extremely accurate. The synthesis shell as mentioned above comprises a gate level description which is a subset of the synthesized block. This description is reduced by deleting elements of the gate level description according to a set of pre-specified criteria.

8 Claims, 13 Drawing Sheets

Conceptual Boundary

SYNTHESIS SHELL GENERATION AND USE IN ASIC DESIGN

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The present invention relates to development of integrated circuits; and more particularly to the tools used in design and development of application specific integrated circuits.

2. Description of Related Art

Automated design tools for application specific integrated circuit (ASIC) designs enable ASIC designs involving millions of usable gates in a single chip. The process of development of such complex ASICs relies on the development and verification tools executed in data processing systems which automate the design. These tools are provided by major electronic design automation or ASIC vendors, such as LSI Logic Corporation, the assignee of the present application. For instance, LSI Logic provides a product known as the C-MDE (trademark) design tools, which provide all the functions necessary to take a design to working silicon. The design tools in commercially available design automation systems include timing analysis tools, floor planning tools, layout tools, synthesis tools, packaging tools and more.

The design process typically involves specification of an ASIC with a behavioral (or register transfer level) description. In a process known as synthesis, the behavioral description is then processed to create an optimized gate-level netlist for the design. With millions of gates in a single design, the netlist becomes very large. Because synthesis is a recursive process, the entire netlist must be stored in the data processing system and processed before it is created in its final form.

As ASIC designs become increasingly more dense, the available computing capability is having difficulty in keeping pace. Thus, systems executing tools for ASIC design require powerful computers with large amounts of memory. As the number of usable gates explodes, speed and memory bottlenecks are created which substantially slow down the development process of complex designs.

In order to address this problem, one electronic design automation vendor, known as Synopsys, provides for a "model" using which a hierarchical design can be converted into library cells with delay information for the cells in the form of timing arcs. This model is substituted for the original design and the original design can be removed from memory during the bottom up synthesis process for the design. This technique proves to be inaccurate, not only on its own environment, but also when the model is transported to a new environment. The synthesis relying on such model results in designs very different from that obtained using the actual gate level netlists of the modeled block. An unacceptable amount of accuracy is lost according to this technique while trying to reduce memory requirements.

Also, as the ASIC industry matures, many vendors provide proprietary core blocks of circuits to users of the ASIC design tools. These proprietary circuits substantially reduce the design time required for ASIC development. However, the vendor of such circuits must disclose details of the design of the core circuit for use in synthesis of the entire ASIC. This results in undesirable disclosure of proprietary information which might otherwise be held confidential.

Accordingly, it is desirable to provide a tool which aids in improving compilation speed and reduces memory requirements during hierarchical synthesis of large ASIC designs without sacrificing accuracy. Further, it is desirable that the result of execution of such a tool is portable across design environments and synthesis tools to facilitate design re-use. Furthermore, it is desirable to provide information about a proprietary module in a format which protects the intellectual property of the owner of the module, while allowing accurate synthesis of ASICs using the module.

SUMMARY OF THE INVENTION

The present invention provides a practical approach for synthesis of million gate ASICs based on the use of synthesis shells. The synthesis shell is generated by beginning with a gate level description of a fully characterized block. This gate level description is reduced by removing internal gates to produce a gate level synthesis shell which is a subset of the synthesized block. The synthesis shell preserves input load and fanout for the block, output delay relative to clock for the block, output drive of the block, setup/hold constraints on input signals relative to the clock for the block, and delay from input to output for pass through signals for the block. Such a synthesis shell can be used as a substitute for original design netlists. Thus, the synthesis shell can be used for hierarchical synthesis in a customer's design environment, or as a deliverable from a provider of ASIC services in order to protect the intellectual property of such a provider. Since all the information that is needed by a synthesizer is available in the synthesis shell in netlist form, and additional information is provided to reconstruct original loading and area information, the shell is extremely accurate.

The synthesis shell as mentioned above comprises a gate level description which is a subset of the synthesized block. This reduced description is obtained by deleting elements of the gate level description according to a set of criteria including the following:

preserve combinatorial paths from an input port to a first storage element;

preserve combinatorial paths from a last storage element to an output port;

preserve direct combinatorial paths from an input port to an output port;

preserve clock distribution paths;

preserve feedback paths from an output port to a storage element, along with the storage element;

preserve feedback paths to direct combinatorial paths in the design;

preserve asynchronous RAM if a write signal to the asynchronous RAM is traced to an input port, else treat the asynchronous RAM like combinatorial logic, and treat synchronous RAMs like storage elements;

preserve storage elements generating internal clocks, if any storage element clocked by an internal clock so generated is connected to an input port or an output port, either through combinatorial logic or directly; and preserve asynchronous paths like reset, clear, et cetera.

Generation of the synthesis shell also includes the step of generating area difference data indicating differences between the area needed for the original block, and the area needed for preserved elements in the synthesis shell, and including the area difference data with the synthesis shell. Further, load information is stored with the synthesis shell indicating the loads within the synthesis shell relevant to the synthesis process, including the loads on each node in a path from a last storage element to an output in the block, and incremental loads on clock and asynchronous paths, where an incremental load is a load on a net compensating for removal of gates connected to the net.

The straightforward implementation of a shell is represented in the form of a netlist, albeit a subset of the original netlist for the block subject of the shell. The shell maintains enough information in the subset of the netlist such that if the original netlist was replaced by this subset it would make no difference to the synthesizer and it would still continue to have access to all the information that it could have obtained from the original netlist. The size of the shell netlist is much smaller, as it is by construction a subset of the original netlist. Thus memory requirements to store the shell netlist are lesser. The shell, which is portable across different process, voltage, and temperature (PVT) conditions, can be made for delivery by a vendor to designers of integrated circuits, or it can be generated by a designer during hierarchical synthesis.

Thus, the present invention can be characterized as a method for synthesizing a gate level description of an integrated circuit module which includes a plurality of blocks from a behavioral or register transfer level description of the module. The method includes propagating design constraints to synthesize the first block in the plurality from the behavioral description of the block. This synthesized, gate level description is reduced to a synthesis shell as discussed above. Next, the method involves synthesizing a second block in the plurality of blocks by processing the behavioral description of the second block with reference to the synthesis shell to produce a gate level description of the at least one other block.

The method of synthesizing the integrated circuit module may further include synthesizing yet another block in the plurality by processing the behavioral description of the other block with reference to the synthesis shells of the first and second blocks in a recursive fashion until the entire design is completed.

Furthermore, the process may include the steps of merging synthesis shells of two blocks into a higher level synthesis shell. The merged file is then reduced into a merged synthesis shell which can replace the combination of lower level synthesis shells.

The present invention can also be characterized as a machine which includes resources to execute the method described above to create synthesis shells and/or stores a synthesis shell made according to the methods described above, and which also includes processing resources for executing synthesis algorithms which utilize synthesis shells.

Accordingly, a practical technique is provided to reduce the amount of processing time, and memory required for synthesizing large ASICs having millions of gates. According to the prior art, synthesis of large designs has caused the compute capacity available to burst at the seams, creating speed and resource bottlenecks. The primary reasons for these bottlenecks is the fact that the entire design netlist has to be kept in memory according to the prior art while synthesis takes place, even blocks in which optimization has been completed. The presence of a synthesized block in memory is required because it may have an impact on the characterization of other blocks under synthesis. The synthesis shell according to the present invention is based on an extraction of the relevant information from a synthesized block such that the characterization of another block under synthesis is still accurate. The advantage gained from this shell is a dramatic decrease in the memory requirement to store the extracted block as opposed to storing the entire netlist of the synthesized block in memory. Accordingly, the advantages of the present invention include the following:

1. reduction in memory requirements;
2. reduction in run time;
3. exact substitute for original design in terms of accuracy of representation and accuracy of use in hierarchical design synthesis;
4. relies on a netlist approach to the synthesis shell which is portable across the synthesis tools and design environments;
5. preserves accuracy of information for use in systems that provide previously designed cells to designers for use in their own ASICs;
6. fits hierarchical top down characterization and bottom up optimization methodologies used in synthesis of an ASICs;
7. protects the intellectual property for proprietary cores represented by the shells.

Other aspects and advantages of the present invention can be seen upon review of the figures, the detailed description, and the claims which follow.

DETAILED DESCRIPTION

Figure 1:
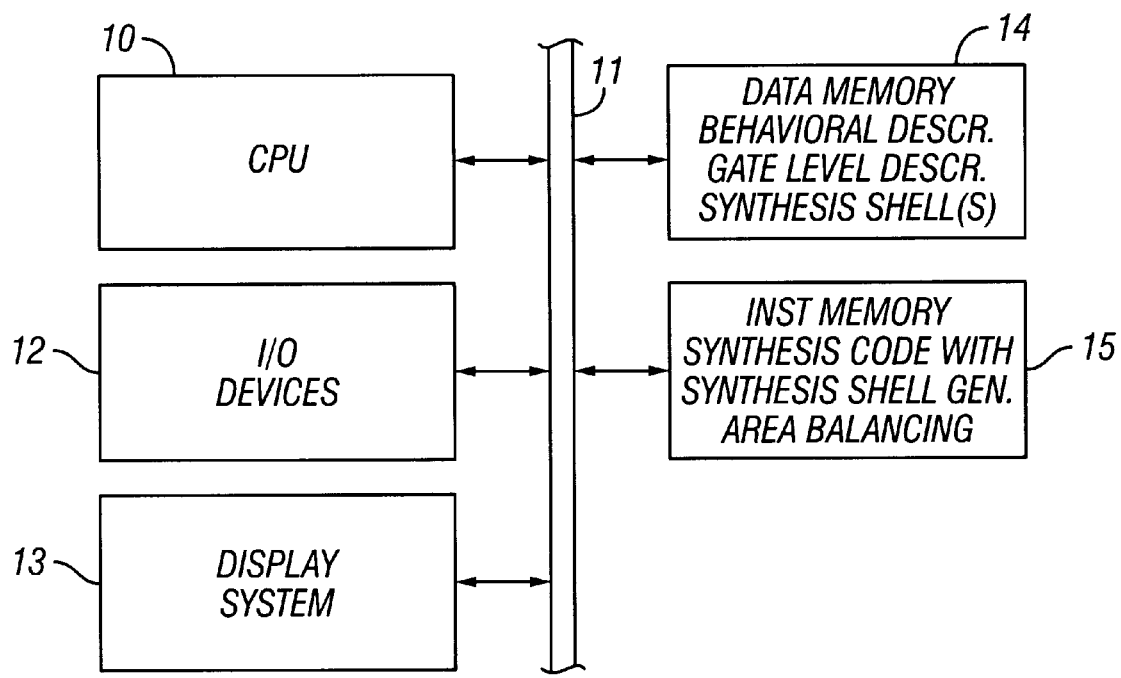
FIG. 1 is a simplified block diagram of a system including processing resources for generating synthesis shells, and for synthesis based on synthesis shells according to the present invention.

The detailed description of preferred embodiments of the present invention is provided with respect to FIGS. 1 through 10, in which FIG. 1 provides a perspective of a machine used in generating synthesis shells, and utilizing synthesis shells in ASIC synthesis according to the present invention. FIGS. 11 through 16 are used to illustrate the full netlist and synthesis shell examples in the Appendices.

The machine shown in FIG. 1 includes a central processing unit 10 which is coupled to a bus 11. Also coupled to the bus 11 are input/output devices 12 and a display system 13. In the machine, a data memory 14 and an instruction memory 15 are provided and connected to the bus 11 for use by the CPU 10. The data memory according to the present invention includes a register transfer level or other behavioral description of an ASIC under development. Also, the data memory is used to store a gate level description of the ASIC after synthesis, and a synthesis shell or shells of circuit blocks within the ASIC under development.

This block diagram provides a heuristic view of a machine which stores and processes the synthesis shells and processes according to the present invention. It is meant to represent, for instance, the components of commercial work stations and personal computers including additional elements described herein. According to the present invention, the instruction memory 15 includes a synthesis tool, with synthesis shell generation processes and area balancing processes for generation of synthesis shells according to the present invention. Further, the synthesis tool is capable of synthesizing blocks within the ASIC under development relying on synthesis shells for blocks already synthesized.

The instruction memory thus includes development and verification tools used to implement a hardware description language such as VERILOG or VHDL. The design tools provide all the functions necessary to take a design from the hardware description level to working silicon. These functions include synthesis tools, timing analysis tools, floor planning tools, layout tools, packaging tools, and more. According to the present invention, these functions also include synthesis shell generation with area balancing as discussed in more detail below.

Figure 2:
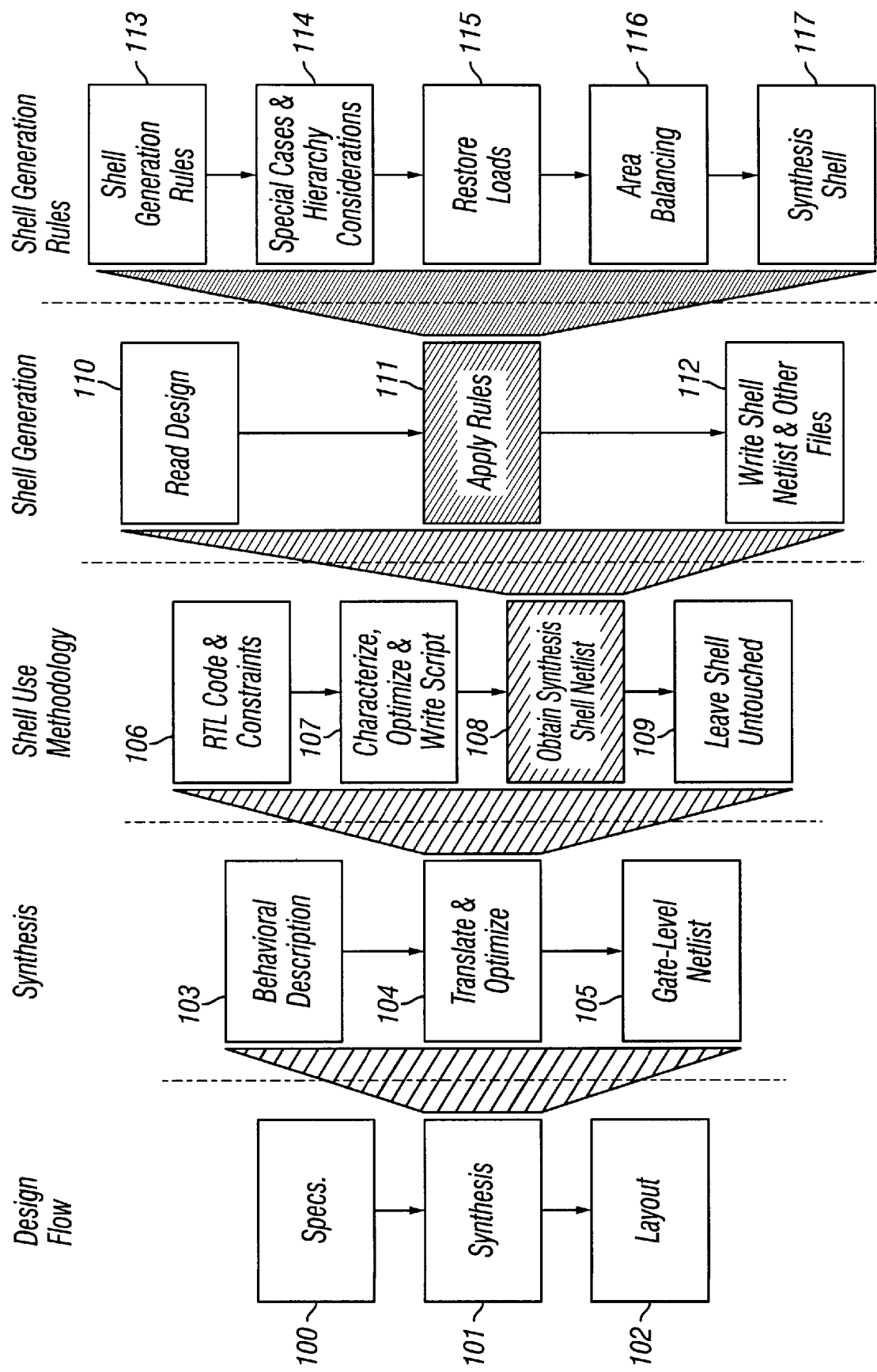
FIG. 2 illustrates the process of ASIC design including synthesis based on the use of synthesis shells, and synthesis shell generation according to the present invention.

FIG. 2 illustrates the context of synthesis shell generation and use according to the present invention. Thus, FIG. 2 illustrates the design flow for development of an ASIC which comprises generation of specifications of the ASIC (block 100), synthesis of the gate level description of the ASIC based on the specification (block 101), and layout of the resulting gate level description (block 102) for use in manufacturing of the ASIC. The present invention provides an improvement in the synthesis resources. Thus, synthesis includes providing a behavioral description of the ASIC using a hardware description language, for instance, at a register transfer level (RTL) (block 103). This behavioral description is translated and optimized (block 104). The result of the translate and optimize step is a gate level netlist for the ASIC (block 105).

According to the present invention, synthesis shells are used during translation and optimization of synthesis. According to synthesis methodology, a behavioral code, e.g. RTL code, and design constraints for the ASIC are supplied (block 106). Based on this information, the ASIC is characterized and optimized to give a gate level description (block 107).

Finally, a synthesis shell netlist is obtained for the block under synthesis (block 108). The shell is marked "do not touch", and is stored for synthesis of further blocks of the ASIC (block 109).

The synthesis shell netlist is obtained using a shell generation process which involves reading the optimized block (block 110).

Rules applying a set of criterion are applied to remove gates from the synthesized design for the circuit block (block 111). Finally, the shell netlist and other files necessary for the shell are written for use in synthesis of the balance of the ASIC and the original block is removed (block 112).

The rules applied at block 111 include basic shell generation rules, which result in removal of gates from the interior of the circuit block which are not necessary for synthesis of the balance of the ASIC (block 113). Special cases and hierarchy considerations are then applied to the resulting gate list level shell (block 114). Loads on nets which are necessary for further synthesis are restored in the synthesis shell (block 115). The area information for the original gate level description for the circuit block is preserved in the reduced netlist used as the synthesis shell by area balancing (block 116). Finally, the synthesis shell results can be used for further synthesis of other blocks (block 117).

Figure 3:
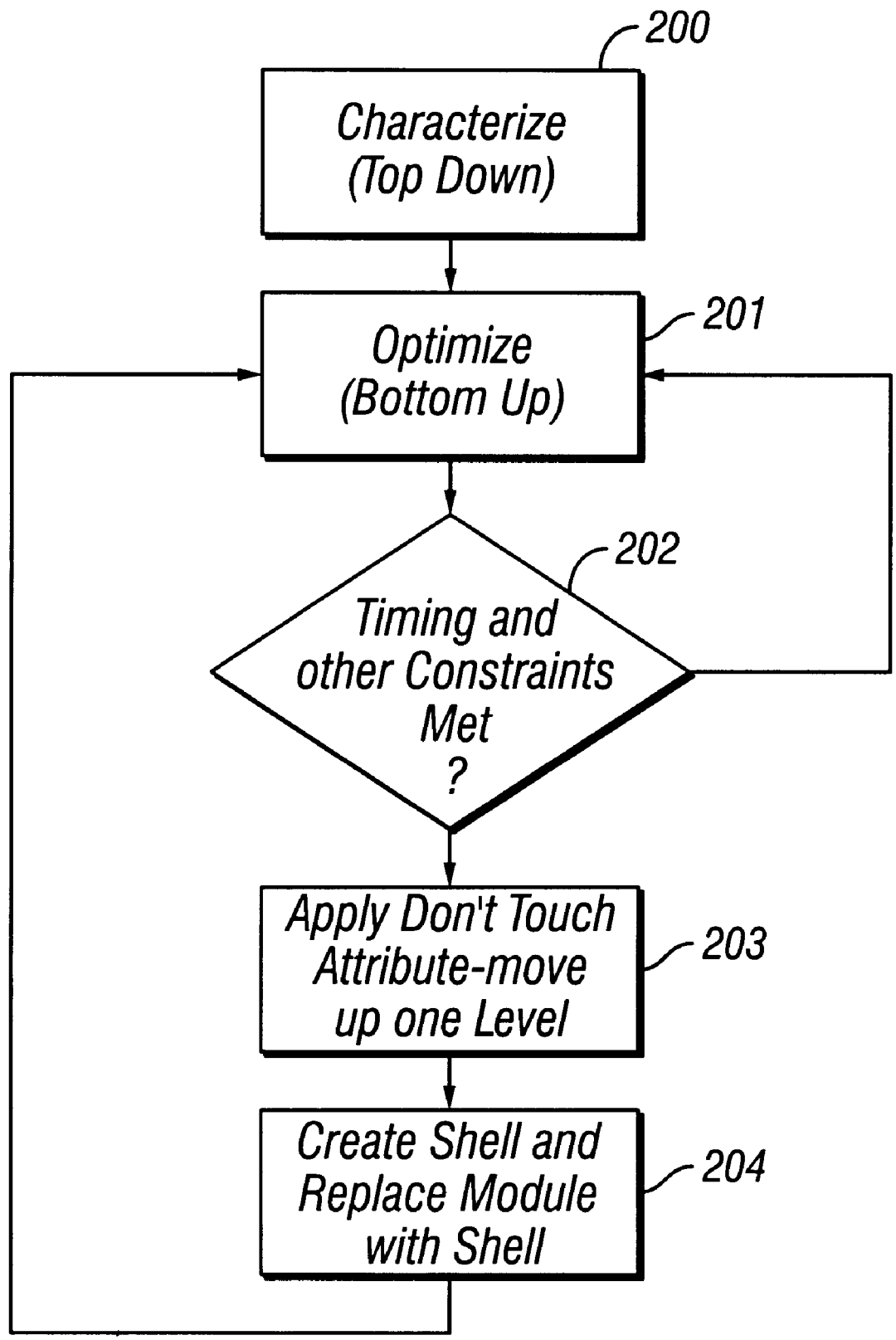
FIG. 3 is a flow chart of a recursive synthesis process based on synthesis shell generation according to the present invention.

FIG. 3 provides more detailed block diagram of a synthesis process according to the present invention. Thus, FIG. 3 defines a synthesis flow used to characterize and synthesize large designs. The input/output attributes and timing constraints are supplied to characterize a module (block 200). Characterization is a top down process which provides for calculation of all I/O attributes on the pins of the module being characterized. This process is executed by propagating the I/O characteristics of the top level module and the effect of the rest of the circuitry to the inputs and outputs of the modules being characterized. Characterization is a top down process because the characteristics of a module on the top level of hierarchy has to be determined before the characteristics of a sub-module can be determined.

Having characterized the module, the process proceeds to optimize the module (block 201). Optimization is a bottom up process beginning with small blocks of the design. A synthesis shell for a module is created as soon as the module has been fully optimized and mapped to gates, that is, synthesized in the current environment. This is also the point where the modules are marked "do not touch".

If the timing and other constraints are met after delay prediction and timing analysis, as indicated at block 202, then the "do not touch" attribute is applied to the module (block 203) and the synthesis shell is created, and the module is replaced with this shell (block 204).

If the timing or other constraints are not met at block 202, then the shell is re-optimized beginning at block 201.

The synthesis shell is created at block 204 by a rule based technique which reduces the gate level description of the optimized block based on a set of criteria. The module for which the shell is to be generated must meet the following constraints:

1. Must be fully synchronous.
2. Must be fully verified to meet all design constraints.
3. Must be at gate level.
4. Must be optimized to the point at which it can be marked "do not touch".

If these constraints are met, then the module can be converted to a synthesis shell.

The synthesis shell must preserve the following information:

1. input load and fanout;
2. output delay relative to clock;
3. set-up/hold constraints on the input signals relative to clock;
4. delay from input to output for all pass through signals.

Figure 4:
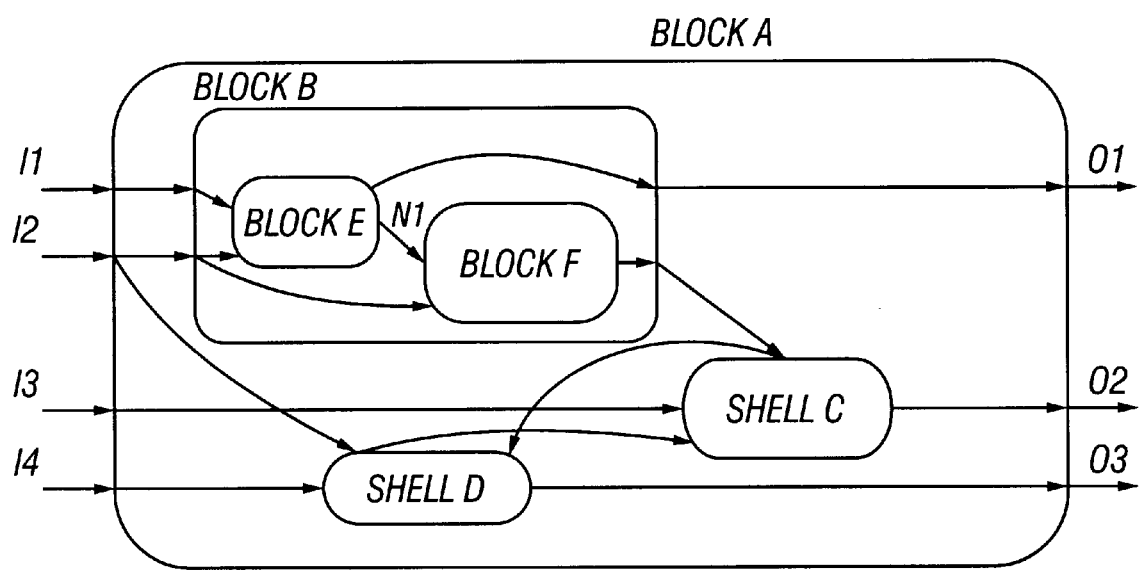
FIG. 4 is an example block diagram used for illustration of synthesis flow according to the present invention.

FIG. 4 is a circuit diagram used for providing an example of synthesis flow based on a synthesis shell according to the present invention. Initially the circuit shown in FIG. 4 is defined at a behavioral level. The object is to optimally synthesize the circuit. The hierarchy defined in the circuit block "A" includes a top level having block "B", and shells "C" and "D". Shells "C" and "D" are shown in the figure to emphasize that a synthesis process may rely on shells already created. Block "B" contains another level of hierarchy defined by blocks "E" and "F". The connectivity is indicated by arrows, where arrow I1 is an input supplied to block "A", block "B", and block "E". I2 is an input connected to block "A", block "B", block "E", and block "F". Also, I2 is supplied as an input to shell "D" and shell "C". I3 is an input to block "A", and to shell "C". Input I4 is an input to block "A" and to shell "D". The outputs O1 through O3 are connected as follows. Output O1 is an output from block "E", block "B", and "A". Output O2 is an output from shell "C" and block "A". Output O3 is produced in shell "D" and supplied as an output from block "A". Internal nets N1 and N2 are connected as follows. Net N1 is generated in block "E" and supplied to block "F". Net N2 is generated in block "F", supplied as an output from block "B", and connected as inputs to shell "C" and shell "D".

In this example, input I2 represents the clock. All other inputs and outputs are specified relative to the clock. In this case the following process of synthesis and characterization is followed to provide an optimal circuit. In the following list of steps, shells "C" and "D" are created from actual blocks "C" and "D". (Note that timing analysis can be performed as soon as a gate level netlist of a block is available.)

Characterize all blocks top down (e.g. B followed by E and F).
Synthesize E and floorplan it and re-characterize E.
Re-characterize B followed by F.
Synthesize F and floorplan it and re-characterize F.
Re-characterize E.
Timing analyze E and F.
Re-synthesize and re-characterize E if needed.
Same with F. (Note: This could end up being a non convergent iterative process and thus criteria to stop the process are applied.)
Mark E and F "do not touch."
Create "shells" for E and F and replace them with their respective shells.
Re-characterize B.
Synthesize B and floorplan it (this may change the floor planning of E and F).
Re-characterize B and perform timing analysis.
Re-synthesize and floorplan B if necessary.
Mark B "do not touch."
Create "shell" for B and replace B with its shell.
Re-characterize C and D.
Synthesize C and floorplan it and re-characterize C.
Re-characterize D.
Synthesize D and floorplan it and re-characterize D.
Timing analyze C and D.
Re-synthesize and re-characterize C if needed.
Same with D (Note: This could end up being a non convergent iterative process and thus criteria to stop the process are applied.)
Mark C and D "do not touch."
Create "shells" for C and D and replace them with their respective shells.
Synthesize A and floorplan it (this may change the floor planning of B, C, and D).
Timing analyze A (everything should work at this point).

Figure 5:
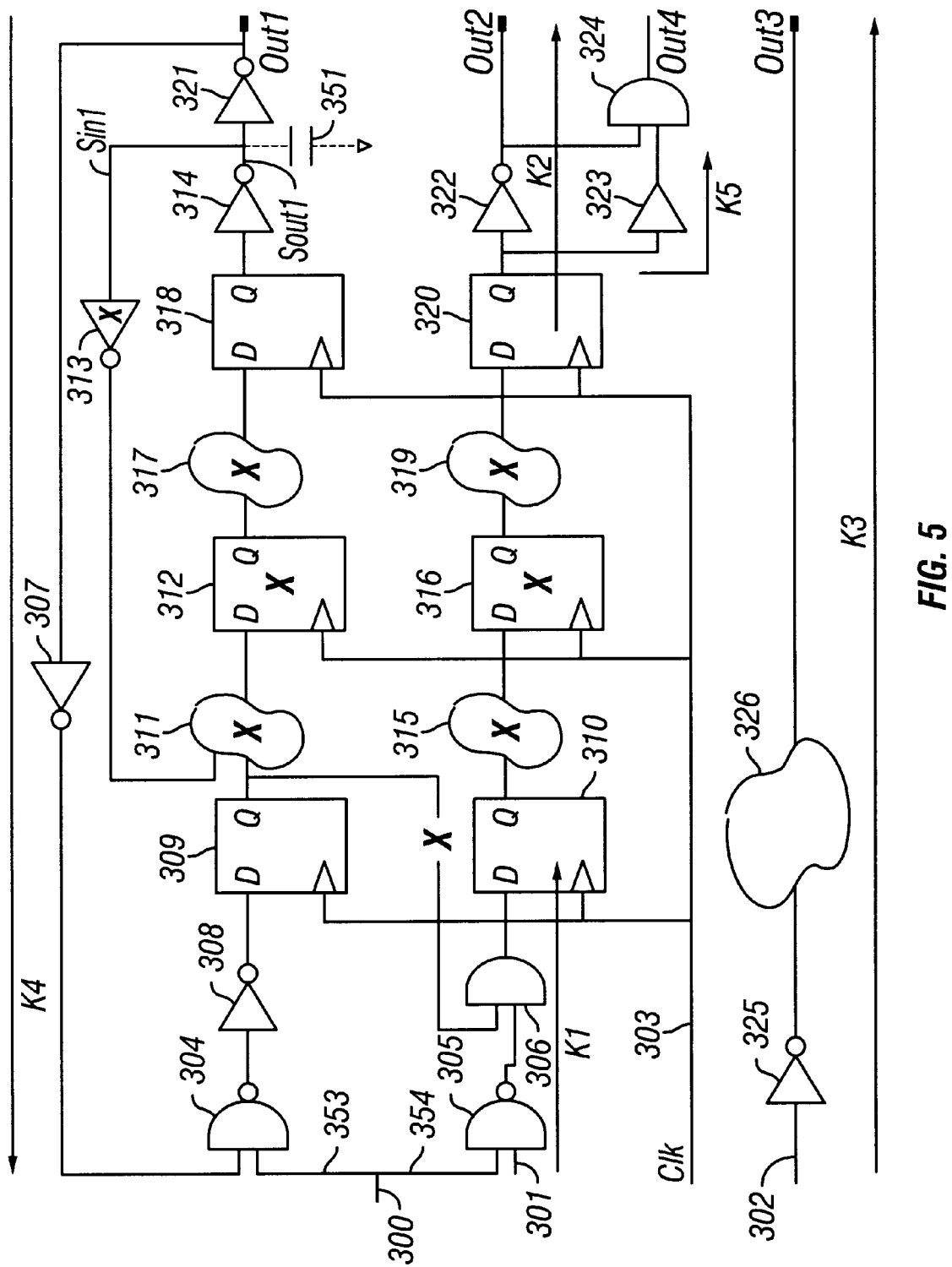
FIG. 5 is an example circuit diagram used for illustrating the deletion of cells based on pre-specified rules for shell generation.

FIG. 5 provides an example circuit used to illustrate criteria used for removing gates from a gate level description of a core circuit block. Gates deleted to form a shell are marked with an "X".

The core circuit block includes an input 300, an input 301, an input 302, and a clock input 303. Also, the core circuit has four outputs, Out1, Out2, Out3, and Out4. The four inputs 300–303 and four outputs Out1–Out4 can be called "roots".

The input 300 has two branches, a first branch 353 is connected to NAND gate 304, and a second branch 354 connected to NAND gate 305. Input 301 is a second input to NAND gate 305. The output of NAND gate 305 is connected as an input to AND gate 306.

The second input to NAND gate 304 is supplied at the output of inverter 307 which is connected to the output Out1. The output of NAND gate 304 is supplied through inverter 308 as a data input to register 309. Register 309 is clocked by the clock signal from line 303. The output of the register 309 is supplied as a second input to AND gate 306. The output of AND gate 306 is the data input of register 310. Register 310 is clocked by the clock signal on line 303. The output of register 309 is supplied through a combinatorial cloud 311, which generates the input to register 312. Another input to the cloud 311 is supplied through inverter 313 from the output of inverter 314.

The output of register 310 is supplied through a combinatorial cloud 315 which generates the data input for register 316. Registers 316 and 312 are clocked by the signal from line 303. The output of register 312 is supplied through a combinatorial cloud 317 which generates the data input for register 318. Similarly, the output of register 316 is supplied through the combinatorial cloud 319 which generates the data input for register 320. Registers 318 and 320 are clocked by the clock signal on line 303.

The output of register 318 is supplied through inverter 314 and inverter 321 to generate the output Out1. The output of register 320 is supplied to inverter 322 to supply the output Out2, and through buffer 323 as an input to AND gate 324. The second input to the AND gate 324 is the Out2 signal. The output of the AND gate 324 supplies the signal Out4.

The input signal 302 is supplied through inverter 325 to a combinatorial cloud 326 which generates the signal Out3.

With reference to FIG. 5, the timing rules for deleting the cells from the gate list can be discussed. In FIG. 5, elements marked with an "X" are not preserved for the shell.

1. Any combinatorial path from an input port to the first storage element on the path in the circuit needs to be preserved. This is necessary to reconstruct any input delay and calculate the setup and hold time of the storage element. Thus for instance, the cells along the arrow K1 in FIG. 5 need to be preserved, including NAND gate 305, AND gate 306, and register 310. In a similar manner, gate 304, gate 308, and register 309 need to be preserved. Note that the net from the output of register 309 to the input of gate 306 is not preserved.

2. Any combinatorial path from a last storage element to an output port needs to maintained. This is necessary to allow a reconstruction of the data arrival time for a block that is dependent on this output port, and the delay after which the data would be available at the output port. Thus, the elements near the arrow K2 in FIG. 5 need to be preserved. That is, register 320 and gate 322 should be preserved according to this rule. Also, register 318, gate 314, and gate 321 should be preserved.

3. Any direct combinatorial path from an input port to an output port of the block for which the shell is made needs to be preserved. This is essential to reconstruct the data arrival times on inputs of other blocks that are dependent on this output from the shell. Thus, the elements along the arrow K3 of FIG. 5 need to be preserved. Therefore, the inverter 325 and the combinatorial cloud 326 should be preserved.

4. Clock distribution networks need to be preserved. Thus, the net defined by line 303 needs to be preserved.

5. Feedback paths originating from an output port which is not buffered affect the setup times of storage elements that they are connected to based on output loading. Thus, such feedback paths should be preserved along with the affected storage elements. Thus, for example, the elements on the branch of the root defined by output Out1, along the path K4 of FIG. 5 need to be preserved. This results in preservation of the gate 307, along with gate 304, gate 308, and register 309.

6. Feedback paths from outputs that comprise pure combinatorial logic need to be preserved. Thus, in FIG. 5, the buffer 323 and the AND gate 324 along with the branch from the output Out2 to the input of the AND gate 324 along arrow K5 are preserved.

7. Asynchronous structures like reset and set need to be preserved. Thus, if any of the registers in the circuit of FIG. 5 included set or reset inputs, then the nets used to generate those signals should be preserved in the synthesis shell.

Although not shown in FIG. 5, in the case of memory elements the following special cases need to be considered.

1. If the memory cell is an asynchronous RAM, it should be treated like any other combinatorial logic, and should not be deleted unless the data feeding it comes from a storage element. This special case occurs when the write signal for the RAM can be traced to an input port. In such case, the RAM should be preserved.

2. Synchronous RAMs are treated like storage elements. If all the signals that arrive and leave the RAM are latched, then the RAM can be deleted; otherwise, it should be preserved.

Figure 6:
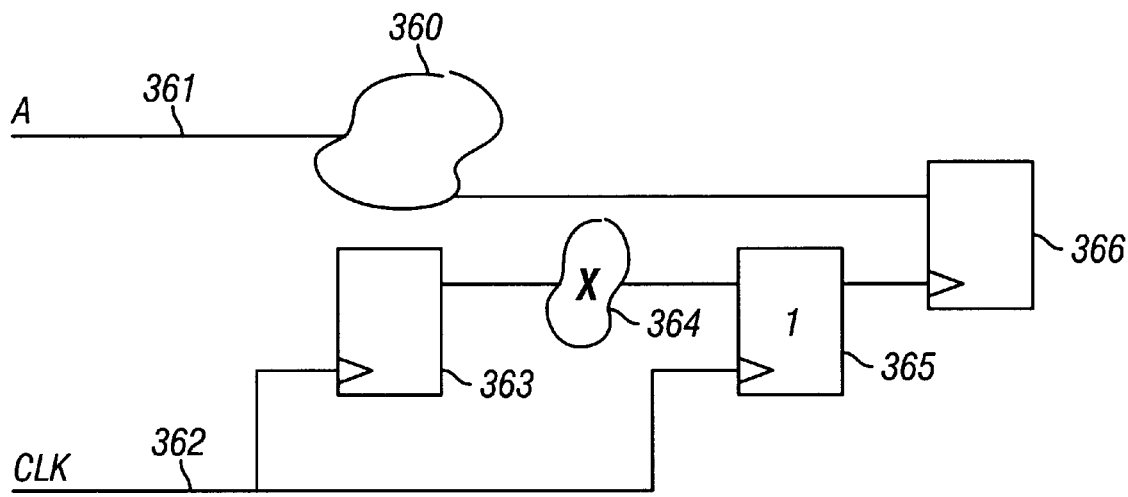
FIG. 6. is an example circuit diagram used for illustration of the preservation of internally generated clocks as one rule according to the present invention.

3. Flip-flops generating internal clocks need to be preserved if any of the storage elements that they clock are connected to an input port or an output port, either through combinatorial logic or directly. This case is illustrated in FIG. 6, which includes a combinatorial cloud 360 which receives the input "A" on line 361. The clock signal is supplied on line 362 which clocks a register 363. The, output of register 363 is supplied through a combinatorial cloud 364 which supplies the data input to a register 365. This register is clocked by the signal on line 322. The output of this register 365 is used to clock a register 366. The data input to the register 366 is supplied at the output of the combinatorial cloud 360. Thus, the element 365 needs to be preserved, because it clocks register 366 which receives its data from input "A" through combinatorial logic.

Figure 7:
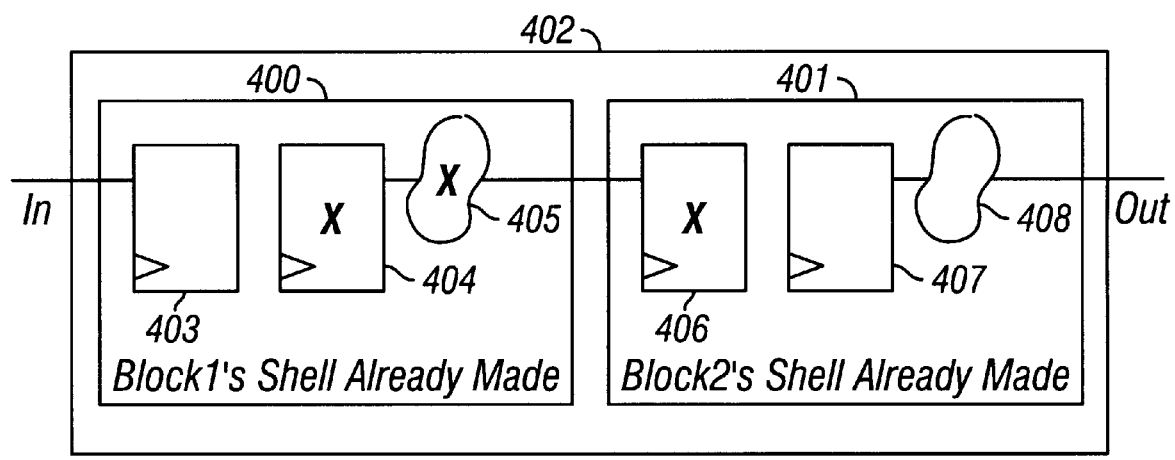
FIG. 7 is an example illustrating merged shells according to one aspect of the present invention.

According to the foregoing criteria, cells can be deleted from a gate level description of a circuit block to create a synthesis shell. In addition, many blocks can be optimized and made into shells. In this case, interconnected shells can be merged into one. The two shells are then viewed from a top level and the preceding rules are applied to a get a super shell of the existing sub shells as illustrated in FIG. 7. Thus, a first shell 400 and a second shell 401 as shown in FIG. 7 are combined into a merged shell 402. The first shell 400 includes the storage element 403 and the storage element 404 which supplies an output through a combinatorial logic 405. The output of the logic 405 is supplied out of the first shell 400 as an input to the second shell 401. The second shell includes the input register 406 and a register 407 which supplies an output through combinatorial logic 408. The merged shell is created which results in deleting the registers 404 and 406 and the combinatorial logic 405 for the super shell 402.

In addition, a path that needs to be preserved based on the rule set laid down above, and which has some deleted gates in its transitive fanout, that is, gates which are deleted that are connected to nodes in the path but are not needed to be stored in the shell, needs to be load restored. Such load balancing is needed in cases where internal feedback gates from a buffered output are deleted, because the load on the path leading from the storage device to an output is affected. The load on each node in a path from the last storage element to an output port needs to be restored. Thus, the capacitance on the net heuristically represented by the capacitor 351 in FIG. 5 needs to be restored to satisfy this case, where gate 315 is a deleted internal feedback gate, which affects the load on Out1.

The incremental loads that appear along the clock net need to be dumped out to perform load restoration on the clock net. Thus, the incremental loads on the clock net 303 which compensate for removal of elements 312 and 316 needs to be preserved.

Since the two primary goals of synthesis are area and timing, the area of the shell as estimated by the synthesizer needs to be the same as that of the original net list from which the shell was produced. The original area is available based on the original gate level description, and so is the area of the reduced netlist generated for the shell. Thus, by modeling a dummy cell with no functionality and an area parameter set equal to the difference in areas between the original and reduced netlists, and instantiating the dummy cell in the reduced netlist, the area balance is provided.

Three types of areas are estimated by the synthesizer. They are combinatorial area, non-combinatorial area, and net area. The combinatorial, non-combinatorial, and net area can be restored by instantiating a dummy combinatorial cell, a dummy sequential cell, and a dummy net. These dummy elements have no functionality but provide area information. The dummy cells are specific to each design technology and should therefore be modeled as library files and compiled into the user's home directory. Since wireload modules actually determine the net area and only one wireload module can be chosen for each level of hierarchy, the area balancing cells should be instantiated as a separate block in the shell netlist.

Thus under the assumption that the top level design possesses one level of hierarchy where three blocks (block1, block2, and block3) exist, invoking a synthesis shell generation routine with a synthesis shell option produces the following files under the following options results in:

1. A synthesis shell netlist containing the gates remaining after rule based deletion of gates and inclusion of dummy gates for area balancing. This netlist also contains a separate level of hierarchy under top level called dum_area, which instantiates three components dum_comb, dum_seq and dum_net. The dum_comb cell is connected to the dum_seq cell by means of a single net. The description of these components is available in the library file.

2. A library file in synopsys format, or any synthesis tool format. This should have one combinatorial cell called dum_comb which possesses no functionality but has an area equal to the area of the deleted combinatorial cells. It should also contain a cell called dum_seq which possesses no functionality but has an area equal to the total area of the non-combinatorial cells deleted from the design. The dum_net is a wireload model which possesses the same wireload area per unit fanout as the difference between the estimated net area of the original and the gate eaten netlist.

3. A block loading file containing the loading information for all the components and nets of the original design.

In the case of merged shells, the synthesis shell program collapses block1 and block2 into a single level of hierarchy and makes a shell. As far as the output files are concerned the program will produce two files, a collapsed netlist for block1, and a collapsed netlist for block2. The only difference between the original shell netlist and the collapsed netlist files is that in the case of the original shell netlist files, the netlist is generated assuming a single top level. The collapsed netlist file however is the netlist generated after combining two or more levels into shells as described above with reference to FIG. 7.

Figure 8:
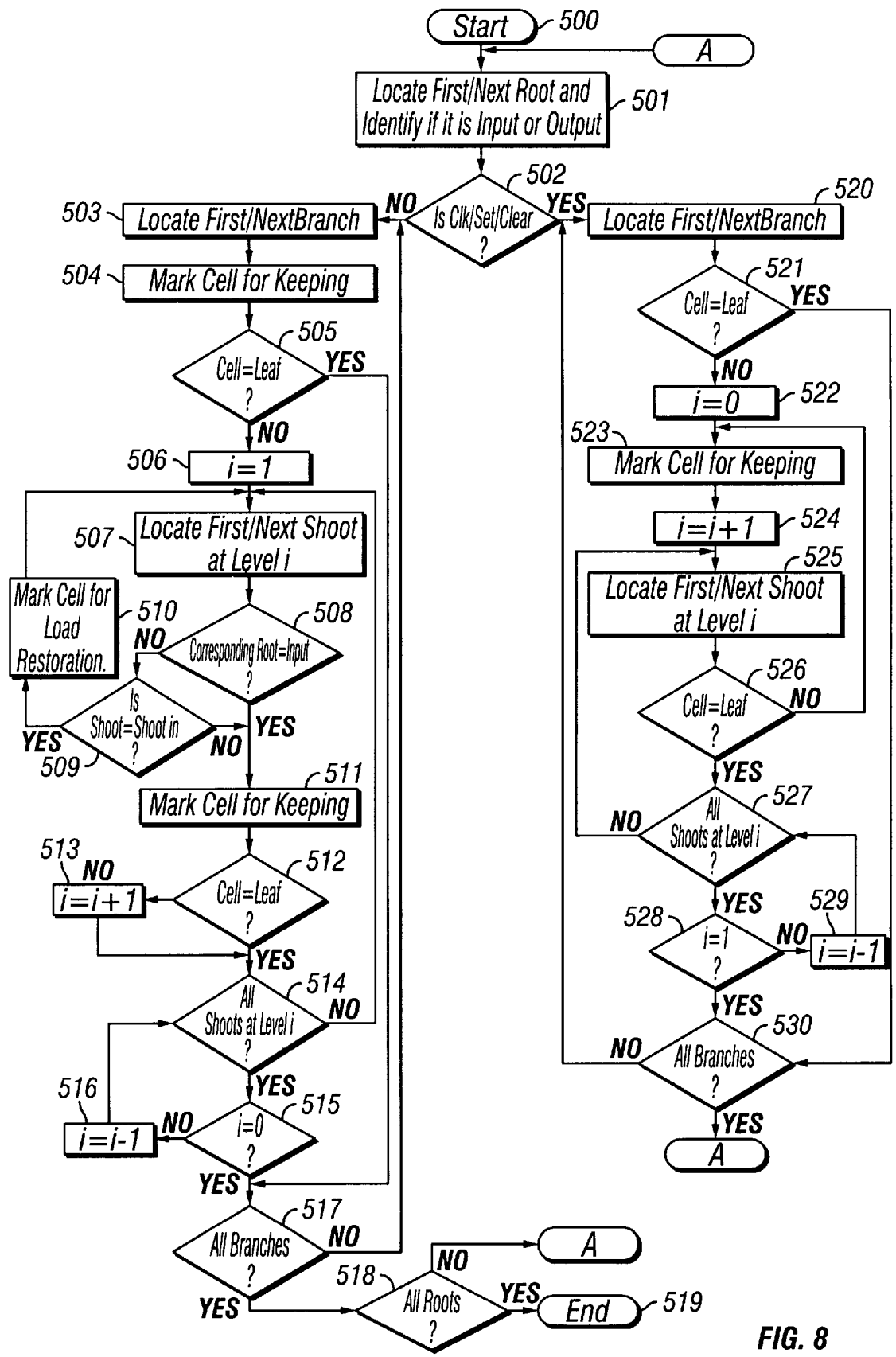
FIG. 8 is a flow chart illustrating the process of shell generation according to the present invention.
Figure 9:
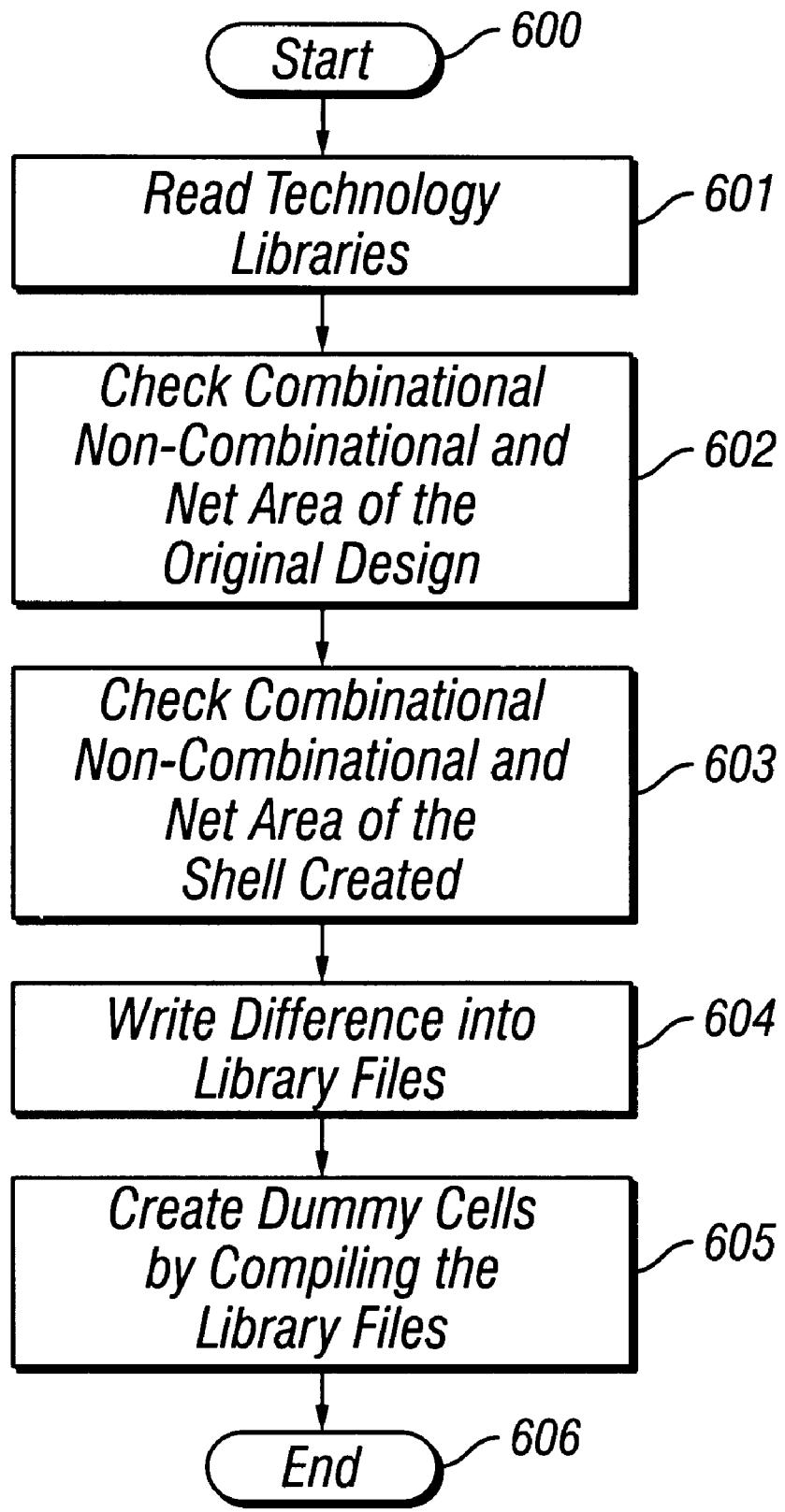
FIG. 9 is a flow chart illustrating a technique for area balancing during shell generation according to the present invention.
Figure 10:
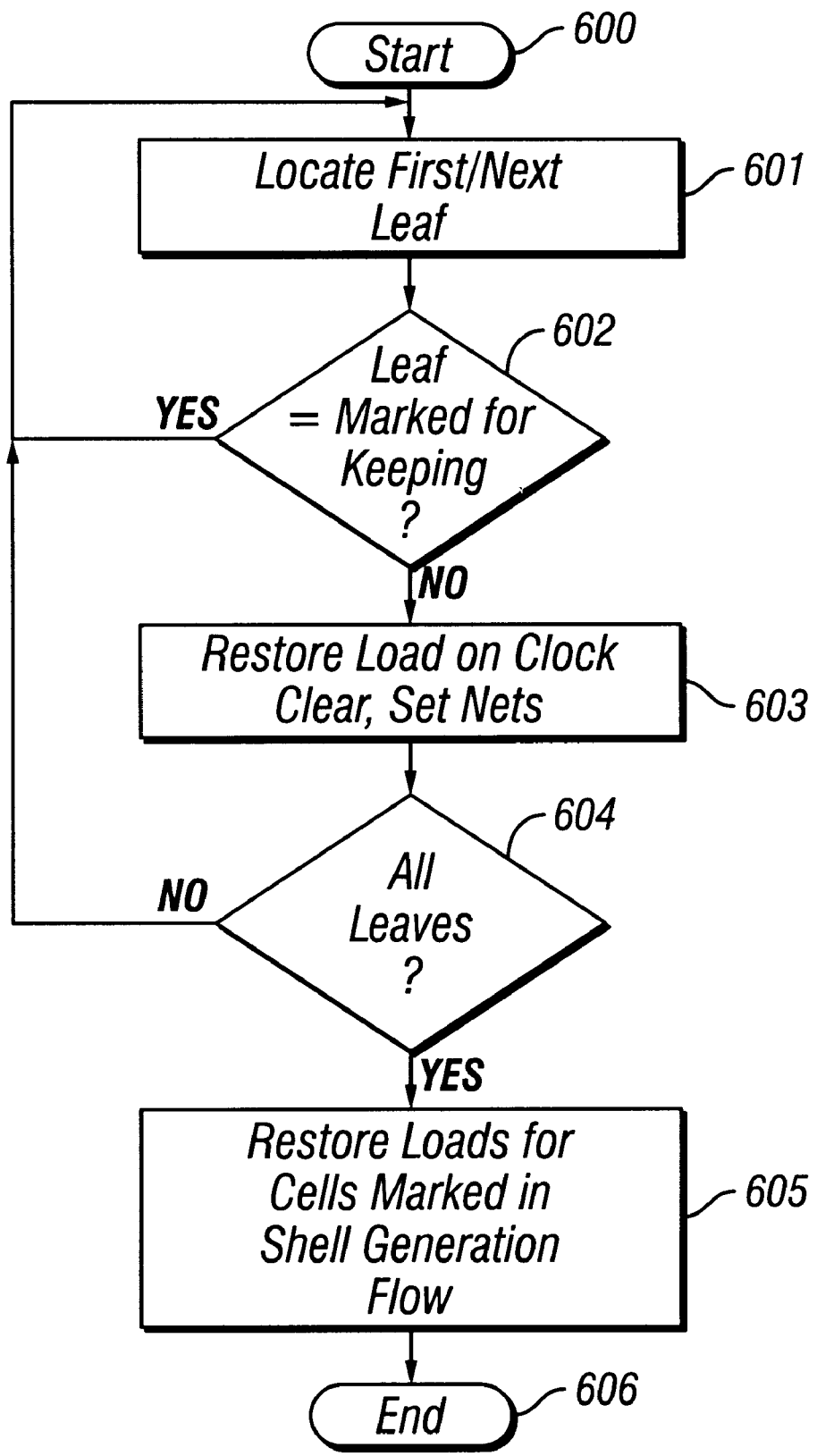
FIG. 10 is a flow chart illustrating a technique for preserving load information on particular nets in the synthesis shell.

FIGS. 8, 9, and 10 provide the shell generation flow, area balancing, and load restoration for use in shell generation according to the present invention. The following terminology has been used in FIG. 8 for the purpose of helping understand the concepts behind shell generation:

"Root". Any input port or output port of a circuit block is termed a root. For example, in FIG. 5, nodes 300, 301, and 302 are roots. Also, the outputs Out1, Out2, Out3, and Out4 are roots.

"Branch". A branch is fanout arising from a root. Thus, with reference to FIG. 1, the path from point 300 to the input of gate 304 represented by line 353 is a branch as well as the path from node 300 to the input of gate 305 represented by net 354 is a branch because it is a fanout of the input port 300.

"Shoot". The shoot is fanout arising from a macrocell. In FIG. 5, the input of the inverter 321 which spans out to inverter 314 and inverter 313 is a shoot.

"Shoot In". A shoot in is a shoot connected to the input of the cell. For instance, the net Sin1 in FIG. 5 is a shoot in to gate 313.

"Shoot Out". A shoot out is a shoot connected to the output of a cell. For example, the net labeled Sout1 in FIG. 5 is a shoot out to gate 314.

"Leaf". A leaf is any storage element where a timing path terminates. All flip-flops and latches in a design are leaves.

FIG. 8 provides the process flow for shell generation. The algorithm begins with the start (block 500). The first step is to locate the next root to be processed and identify whether it is an input or an output (block 501). Next, the algorithm determines whether the root carries a clock, set or clear signal (block 502). If it is not a clock, set or clear signal at block 502, then the algorithm locates the next (or first) branch on the root (block 503). For this branch, the cell on the branch is marked to be kept (block 504). Next, it determines whether the cell is a leaf (block 505). If it is not a leaf, then a level index "i" is set to 1 (block 516) and the next shoot on the cell is located for this level (block 507). Next, the algorithm, determines whether the corresponding root is an input root (block 508). If it is not an input, then it determines whether the shoot is a shoot in (block 509). If it is a shoot in at block 509, then the cell is marked for load restoring (block 510), algorithm loops back to block 507 to locate the next shoot. If it is not a shoot in, or the corresponding root was an input at block 508, then the algorithm marks the cell to be kept (block 511). Next, the algorithm determines whether the cell marked to be kept is a leaf (block 512). If it is not a leaf, then the index "i" as incremented (block 513), else the index "i" is not changed. Next, the algorithm determines whether all shoots on this index level "i" have been processed (block 514). If not, the algorithm loops back to block 507 to process the next shoot. If all the shoots have been processed for this level, at block 514, then the algorithm determines whether the index "i" is zero (block 515). If "i" is not zero, then "i" is decremented by one (block 516) and the algorithm loops to block 514. If "i" is zero at block 515, the algorithm determines whether all the branches for the root have been processed at block 517. If not, it loops back to block 503 to process the next branch. If all the branches on the root have been processed, then the algorithm determines whether all of the roots have been processed (block 518). If not, the algorithm branches back to point A at block 501 as shown in the figure. If all the roots have been processed, then the algorithm is finished as indicated by the end (block 519).

If at block 502 it was determined that the root was a clock, set or clear signal, then the algorithm locates the next (or first) branch to be processed (block 520). Next, it is determined whether the cell on this branch is a leaf (block 521). If it is a leaf, the algorithm determines whether there are other branches on the root (block 530). If all branches on the root have not been processed, the algorithm loops back to block 520. If at block 530 it is determined that all branches for the root are done, then it branches to block 501 to process the roots. If the cell is not a leaf at block 521, then the algorithm branches to block 522, where an index "i" is set to zero. Then the algorithm marks the cell to be kept (block 523), and increments the index "i" by one (block 524). After incrementing the index, the algorithm locates the first or next shoot at the level "i" (block 525). Then it is determined whether the cell on the shoot is a leaf (block 526). If the cell is not a leaf, the algorithm branches to block 523 to mark the cell to be kept. If the cell is a leaf, then the algorithm determines whether all the shoots at level "i" have been processed (block 527). If not, then the algorithm moves back to block 525 to process the next shoot. If all the shoots have been processed, then the algorithm tests whether the index "i" is equal to one (block 528). If the index is not one, then it is decremented by one (block 529), and the algorithm moves back to block 527 to process other shoots at the lower level. If at block 528, the index "i" is equal to one, then the algorithm branches to block 530 to determine whether all branches have been processed. If not, the algorithm moves back to block 520 to proceed with the next branch. If all branches have been processed at block 530, then the algorithm loops back to block 501 to continue processing.

FIG. 9 illustrates the area balancing processes for the timing shell netlist. This process begins with the start block 600. The first step involves reading the technology libraries for the circuit block being synthesized (block 601). Next, the combinatorial, non-combination, and net area of the original design is determined (block 602). Next, the combinatorial, non-combinatorial, and net area of the shell created are determined (block 603). The difference between these two files is written into the library files (block 604). Next the dummy cells for the combinatorial, non-combinatorial, and net area of the shell are created by compiling the library files (block 605). These dummy cells are inserted in the timing shell and the process ends (block 606).

FIG. 10 illustrates a process of load restoration for the synthesis shell generated according to FIGS. 8 and 9. This algorithm begins with the start block 600. The first step involves locating the first or next leaf in the circuit (block 601). The next step involves determining whether this leaf had been marked for keeping in the cell generation process (block 602). If not, then the load on clock, clear and set nets for the leaf are restored (block 603). If it had been marked for keeping, then the algorithm loops back to block 601.

After block 603, then the algorithm determines whether all the leaves have been processed (block 604). If not, then the algorithm loops back to block 601 to process the next leaf. If all the leaves had been processed at block 604, then the algorithm proceeds to block 605, where the loads on the cells marked for load restoration in the shell generation process are load restored. After this process, the algorithm ends (block 606).

Figure 11:
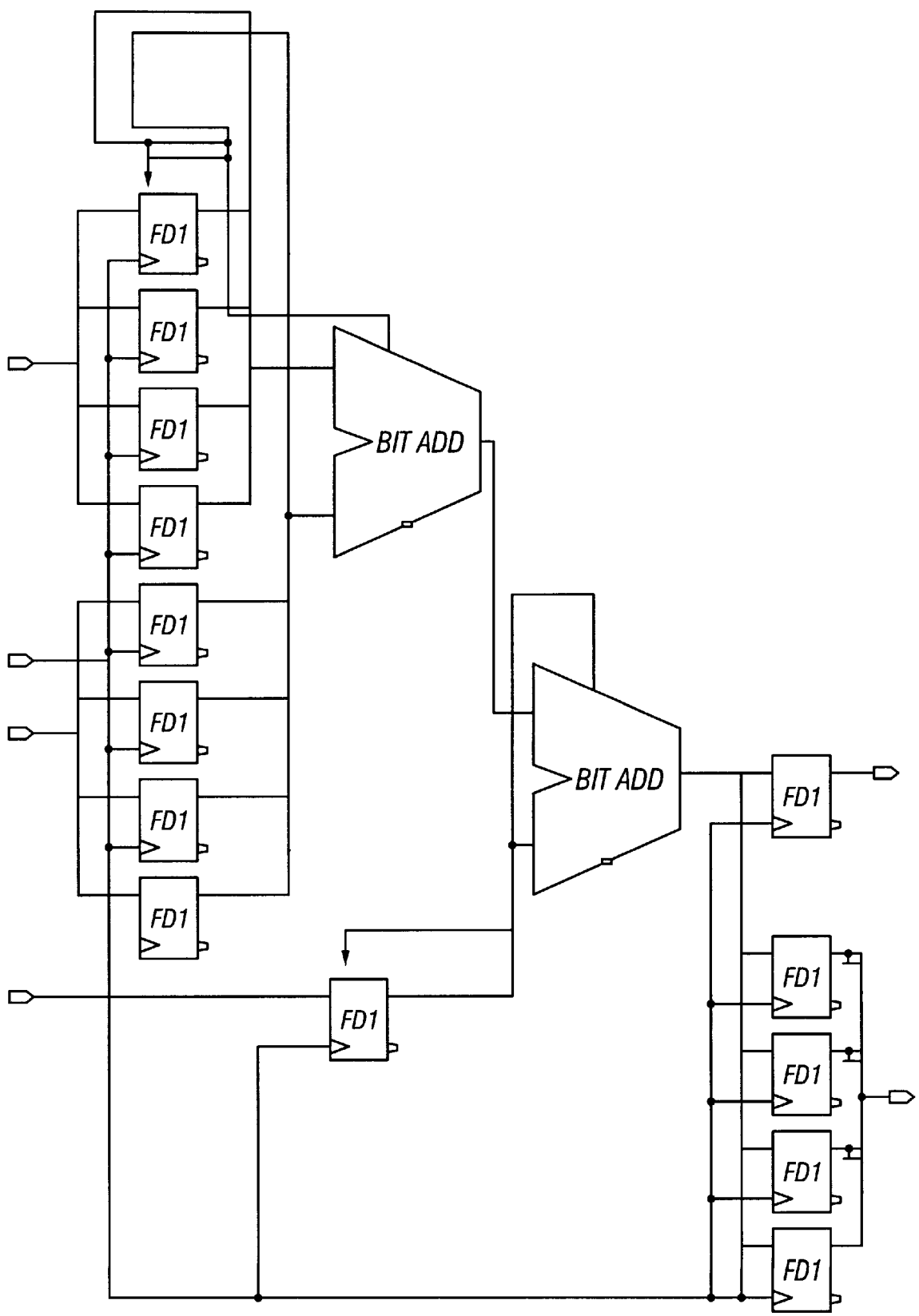
FIGS. 11 through 16 are schematics of a representative circuit block, and shell of a circuit block as represented by the code samples in the Appendices to describe an example of the synthesis shell process according to the present invention.
Figure 12:
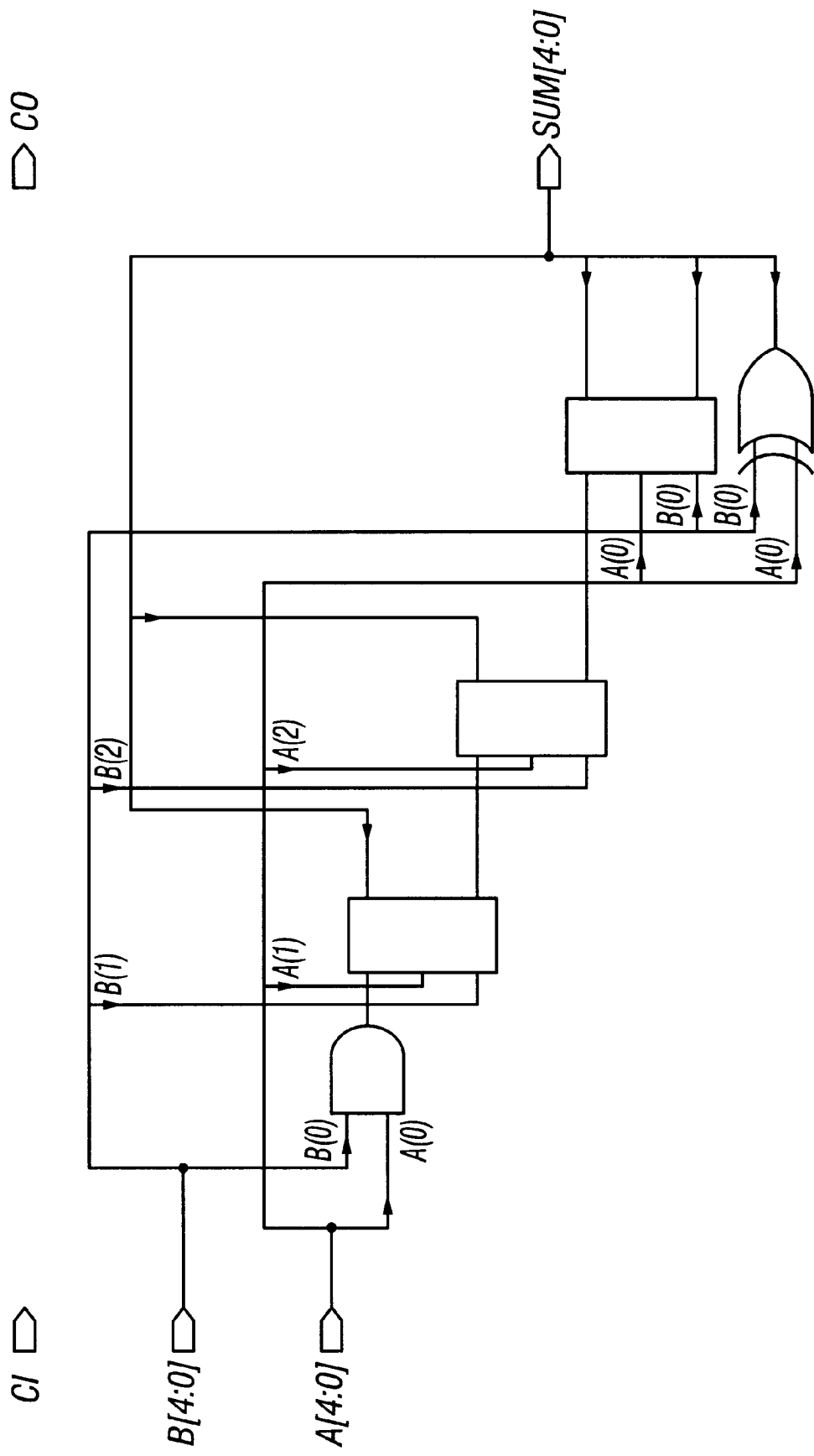
Figure 13:
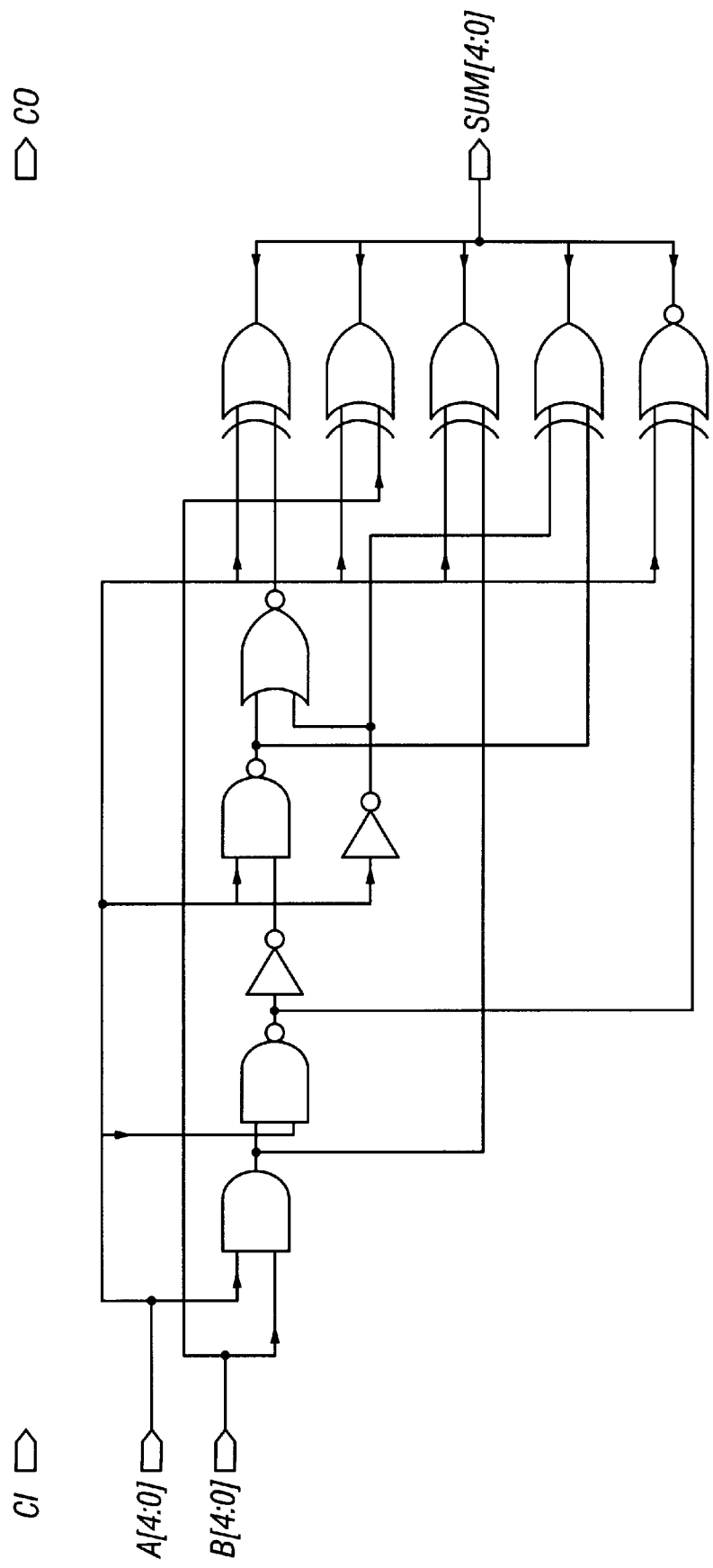
Figure 14:
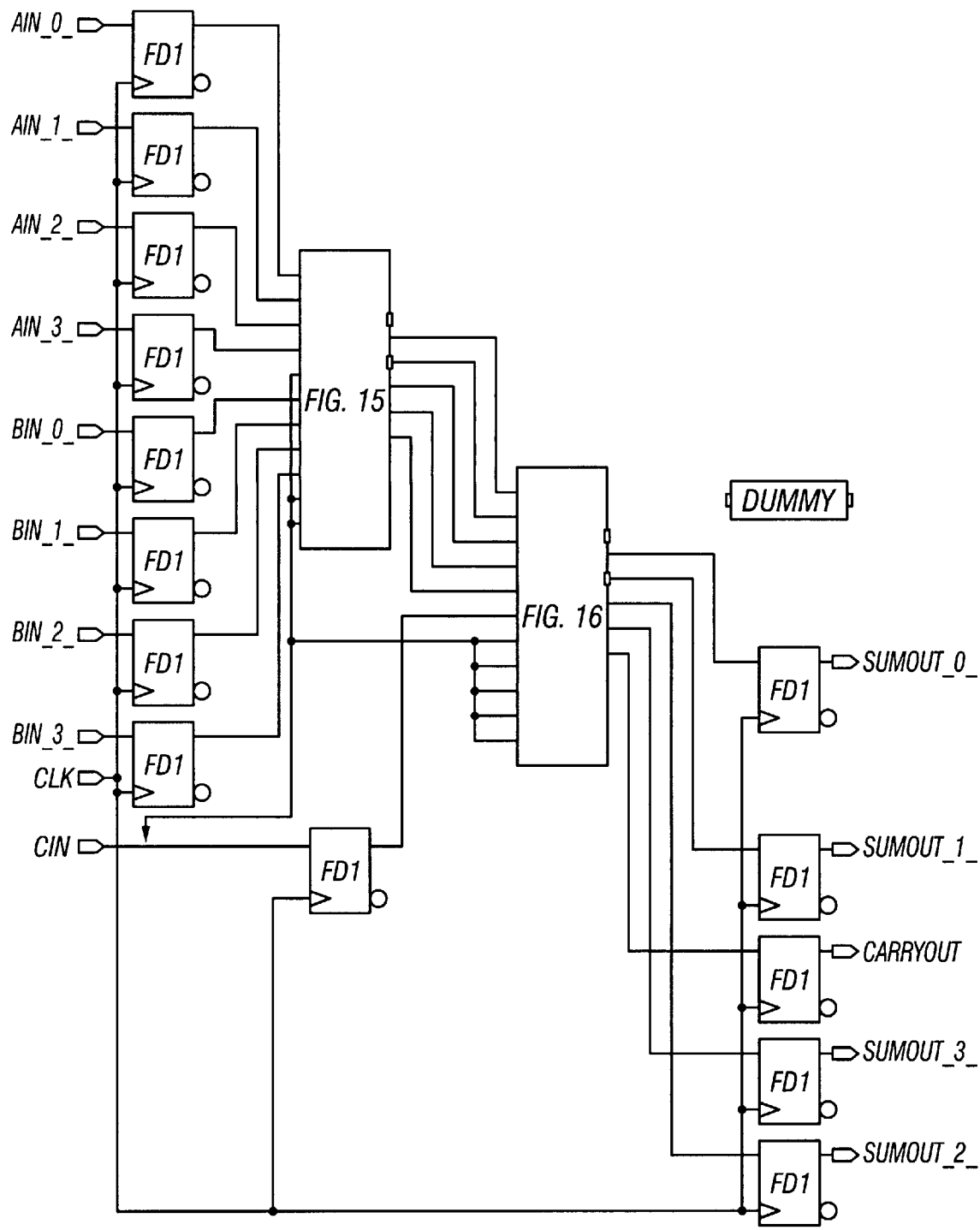

Attached hereto as Appendices A, B, and C, where Appendix A is a sample of behavioral code in VERILOG language for an adder, Appendix B is a synthesized netlist in NDL format for the adder represented by the code in Appendix A, and Appendix C is a synthesis shell in NDL format which is produced according the present invention. The full synthesized netlist shown in Appendix B describes a circuit having 28 macrocells. For reference, FIGS. 11, 12, and 13 provide a top level schematic of this synthesized netlist. As can be seen in FIG. 11, there are 14 registers labeled FDI plus two adder sub-blocks labeled BIT ADD in the top level schematic. FIG. 12 shows the first adder sub-block having 5 gates, and FIG. 13 shows the second adder sub-block having 9 gates. This corresponds to the 28 gates defined by the full gate level netlist of the adder described in Appendix B.

Figure 15:
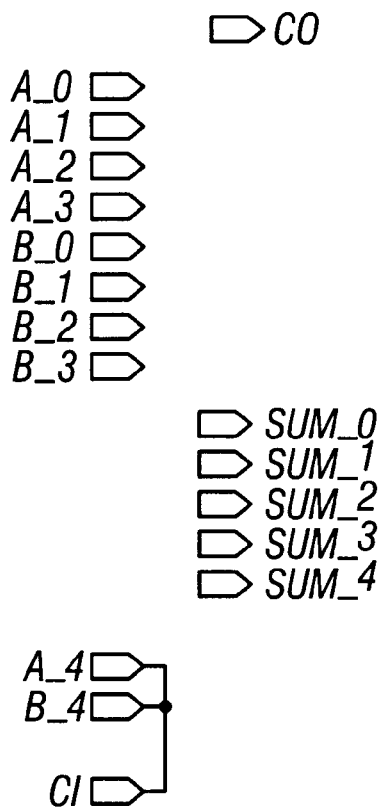
Figure 16:
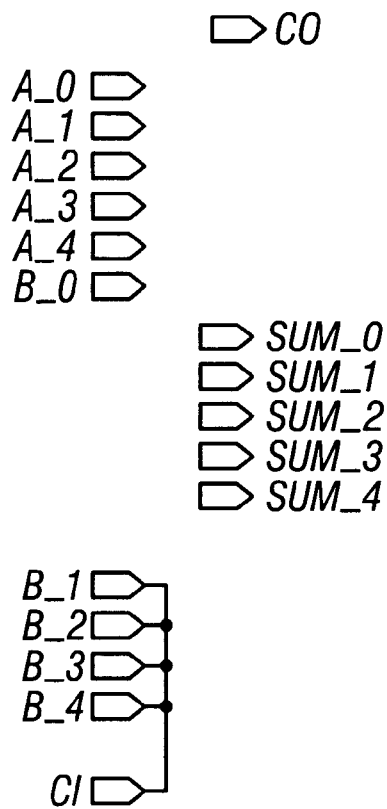

Appendix C shows the reduced netlist for a synthesis shell according to the present invention. This reduced netlist has only 14 gates and a dummy cell represented by the schematic in FIG. 14. As can be seen, FIG. 14 has 14 gates, and 2 gate eaten blocks. The gate eaten blocks can be represented by the schematics shown in FIGS. 15 and 16. As can be seen, FIGS. 15 and 16 are simply the inputs and outputs of the sub-block in the circuit. Thus Appendix C, shows a resulting synthesis shell in netlist format. In Appendix C, the dummy cell is represented by line 71. As mentioned above, this dummy cell provides a reference to a cell library in which the description of the dummy cell for the reduced netlist is provided. A representative dummy module begins on line 122 of Appendix C. Line 128 points to the fake cell fk__arseq() in the area balancing library for sequential area, line 129 points to the fake cell fk__ar__com() for combinatorial area. The net defined in the dummy module is the area balancing "dum__net" described above.

Accordingly a new tool to aid in synthesis of large scale integrated circuits has been provided based on a synthesis shell construct used in data processing environment. The synthesis shell can be delivered to customers relying on the represented circuit block for design of an ASIC, or can be generated as part of the synthesis of a large scale integrated circuit. The use of a synthesis shell vastly reduces the processing requirements in terms of time and memory consumption for synthesis of large ASICs.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

APPENDIX A

Copyright LSI Logic 1995

```
1    module bitadd (sumout, carryout, ain, bin, cin, clk);
2    input [3:0] ain, bin;
3    input cin, clk;
4    output [3:0] sumout;
5    output carryout;
6    reg [3:0] sumout, a_tmp, b_tmp;
7    reg carryout, cin_tmp;
8    wire [3:0] ain, bin, s_tmp;
9    wire cin, c_tmp;

10   always @(posedge clk)
11   begin
12       carryout = c_tmp;
13       sumout = s_tmp;
14       cin_tmp = cin;
15       a_tmp = ain;
16       b_tmp = bin;
17   end 18   assign {c_tmp, s_tmp} = a_tmp + b_tmp + cin_tmp;

19   endmodule
```

APPENDIX B

Copyright LSI Logic 1995

```
1    compile;
2    directory master;

3    /****** technology used: lca300k ******/
4    module bitadd_dw01_add_5_0;

5    inputs a_4,a_3,a_2,a_1,a_0,b_4,b_3,b_2,b_1,b_0,ci;
6    outputs sum_4,sum_3,sum_2,sum_1,sum_0,co;

7    level function;
8    define 9    a_3_ = (a_3);
10   a_2_ = (a_2);
11   a_1_ = (a_1);
12   a_0_ = (a_0);
13   b_3_ = (b_3);
14   b_2_ = (b_2);
15   b_1_ = (b_1);
16   b_0_ = (b_0);
17   sum_4_ = (sum_4);
18   sum_3_ = (sum_3);
19   sum_2_ = (sum_2);
20   sum_1_ = (sum_1);
21   sum_0_ = (sum_0);

22   u1(carry_1_=z) = an2(b_0_=a,a_0_=b);
23   u2(sum_0_=z) = eo(a_0_=a,b_0_=b);
24   u3(sum_3_=s,sum_4_=co) = fa1a(carry_3_=ci,a_3_=a,b_3_=b);
25   u4(sum_2_=s,carry_3_=co) = fa1a(carry_2_=ci,a_2_=a,b_2_=b);
26   u5(sum_1_=s,carry_2_=co) = fa1a(carry_1_=ci,a_1_=a,b_1_=b);

27   end module;
28   module bitadd_dw01_add_5_1;

29   inputs a_4,a_3,a_2,a_1,a_0,b_4,b_3,b_2,b_1,b_0,ci;
30   outputs sum_4,sum_3,sum_2,sum_1,sum_0,co;
```

```
31      level function;
32      define 33      a_4_ = (a_4);
34      a_3_ = (a_3);
35      a_2_ = (a_2);
36      a_1_ = (a_1);
37      a_0_ = (a_0);
38      b_0_ = (b_0);
39      sum_4_ = (sum_4);
40      sum_3_ = (sum_3);
41      sum_2_ = (sum_2);
42      sum_1_ = (sum_1);
43      sum_0_ = (sum_0);

44      u7(carry_1_=z) = an2(b_0_=a,a_0_=b);
45      u8(sum_0_=z) = eo(a_0_=a,b_0_=b);
46      u9(sum_4_=z) = eo(carry_4_=a,a_4_=b);
47      u1(carry_4_=z) = an2(a_3_=a,carry_3_=b);
48      u2(sum_3_=z) = eo(carry_3_=a,a_3_=b);
49      u3(carry_3_=z) = an2(a_2_=a,carry_2_=b);
50      u4(sum_2_=z) = eo(carry_2_=a,a_2_=b);
51      u5(carry_2_=z) = an2(a_1_=a,carry_1_=b);
52      u6(sum_1_=z) = eo(carry_1_=a,a_1_=b);

53      end module;
54      module bitadd;

55      inputs ain_3_,ain_2_,ain_1_,ain_0_,bin_3_,bin_2_,bin_1_,bin_0_,cin,clk;
56      outputs sumout_3_,sumout_2_,sumout_1_,sumout_0_,carryout;

57      level function;
58      define 59      sumout_3_ = (sumout_3_);
60      sumout_2_ = (sumout_2_);
61      sumout_1_ = (sumout_1_);
62      sumout_0_ = (sumout_0_);
63      carryout = (carryout);
64      ain_3_ = (ain_3_);
65      ain_2_ = (ain_2_);
```

```
66      ain_1_ = (ain_1_);
67      ain_0_ = (ain_0_);
68      bin_3_ = (bin_3_);
69      bin_2_ = (bin_2_);
70      bin_1_ = (bin_1_);
71      bin_0_ = (bin_0_);
72      cin = (cin);
73      clk = (clk);

74      n90 = (nc/0/);
75      n91 = (nc/0/);
76      carryout_reg(carryout=q) = fd1(carryout_tmp=d,clk=cp);
77      sumout_reg_3_(sumout_3_=q) = fd1(sumout_tmp_3_=d,clk=cp);
78      add_20(carryout_tmp=sum_4,sumout_tmp_3_=sum_3,sumout_tmp_2_=sum_2,
79         sumout_tmp_1_=sum_1,sumout_tmp_0_=sum_0) =
80      bitadd_dw01_add_5_1(n72_1_=
81         a_4,n72_2_=a_3,n72_3_=a_2,n72_4_=a_1,n72_5_=a_0,n91=b_4,n91=
82      b_3,n91=b_2,    n91=b_1,cin_tmp=b_0,n91=ci);
83      sumout_reg_2_(sumout_2_=q) = fd1(sumout_tmp_2_=d,clk=cp);
84      sumout_reg_1_(sumout_1_=q) = fd1(sumout_tmp_1_=d,clk=cp);
85      bin_tmp_reg_3_(bin_tmp_3_=q) = fd1(bin_3_=d,clk=cp);
86      sumout_reg_0_(sumout_0_=q) = fd1(sumout_tmp_0_=d,clk=cp);
87      bin_tmp_reg_2_(bin_tmp_2_=q) = fd1(bin_2_=d,clk=cp);
88      bin_tmp_reg_1_(bin_tmp_1_=q) = fd1(bin_1_=d,clk=cp);
89      cin_tmp_reg(cin_tmp=q) = fd1(cin=d,clk=cp);
90      bin_tmp_reg_0_(bin_tmp_0_=q) = fd1(bin_0_=d,clk=cp);
91      add_20_1(n72_1_=sum_4,n72_2_=sum_3,n72_3_=sum_2,n72_4_=sum_1,n72_
92      5_=sum_0
93         ) = bitadd_dw01_add_5_0(n90=a_4,ain_tmp_3_=a_3,ain_tmp_2_=a_2,
94
95      ain_tmp_q59_1_=a_1,ain_tmp_0_=a_0,n90=b_4,bin_tmp_3_=b_3,bin
96      _tmp_2_=b_2,    bin_tmp_1_=b_1,bin_tmp_0_=b_0,n90=ci);
97      ain_tmp_reg_0_(ain_tmp_0_=q) = fd1(ain_0_=d,clk=cp);
98      ain_tmp_reg_1_(ain_tmp_q59_1_=q) = fd1(ain_1_=d,clk=cp);
99      ain_tmp_reg_2_(ain_tmp_2_=q) = fd1(ain_2_=d,clk=cp);
100     ain_tmp_reg_3_(ain_tmp_3_=q) = fd1(ain_3_=d,clk=cp);

101     end module;

102     end compile;
103     end;
```

APPENDIX C

Copyright LSI Logic 1995

1     compile;
2     directory master;

3     /**** technology used: lca300k ****/ module bitadd_dw01_add_5_1;

4     inputs a_4,a_3,a_2,a_1,a_0,b_4,b_3,b_2,b_1,b_0,ci; outputs sum_4, sum_3,
5     sum_2, sum_1, sum_0, co;

6     level function;
7     define 8         b_3 = (b_4);
9         b_2 = (b_4);
10        b_1 = (b_4);
11        ci = (b_4);
12        sum_0 = (sum_0_);
13        sum_1 = (sum_1_);
14        sum_2 = (sum_2_);
15        sum_3 = (sum_3_);
16        sum_4 = (sum_4_);
17        b_0 = (b_0_);
18        a_0 = (a_0_);
19        a_1 = (a_1_);
20        a_2 = (a_2_);
21        a_3 = (a_3_);
22        a_4 = (a_4_);

23     end module;

24     module bitadd_dw01_add_5_0;

25     inputs a_4,a_3,a_2,a_1,a_0,b_4,b_3,b_2,b_1,b_0,ci;
26     outputs sum_4,sum_3,sum_2,sum_1,sum_0,co;

27     level function;
28     define 29        b_4 = (a_4);
30        ci = (a_4);
31        sum_0 = (sum_0_);

```
32          sum_1 = (sum_1_);
33          sum_2 = (sum_2_);
34          sum_3 = (sum_3_);
35          sum_4 = (sum_4_);
36          b_0 = (b_0_);
37          b_1 = (b_1_);
38          b_2 = (b_2_);
39          b_3 = (b_3_);
40          a_0 = (a_0_);
41          a_1 = (a_1_);
42          a_2 = (a_2_);
43          a_3 = (a_3_);

44      end module;

45      module bitadd;

46      inputs ain_3_,ain_2_,ain_1_,ain_0_,bin_3_,bin_2_,bin_1_,bin_0_,cin,clk;
47      outputs sumout_3_,sumout_2_,sumout_1_,sumout_0_,carryout;

48      level chip;
49      define 50      carryout_reg(carryout=q, carryout_reg.qn=qn) = fd1(carryout_tmp=d, clk=cp);
51      sumout_reg_3_(sumout_3_=q, sumout_reg_3_.qn=qn) =fd1(sumout_tmp_3_=d,
52          clk=cp);
53      add_20(carryout_tmp=sum_4, sumout_tmp_3_=sum_3,
54          sumout_tmp_2_=sum_2, sumout_tmp_1_=sum_1,
55          sumout_tmp_0_=sum_0) = bitadd_dw01_add_5_1(n72_1_=a_4,
56          n72_2_=a_3, n72_3_=a_2, n72_4_=a_1, n72_5_=a_0,
57          nc/0/=b_4,nc/0/=b_3, nc/0/=b_2, nc/0/=b_1,cin_tmp=b_0, nc/0/=ci);
58      sumout_reg_2_(sumout_2_=q,sumout_reg_2_.qn=qn) = fd1(sumout_tmp_2_=d,
59          clk=cp);
60      sumout_reg_1_(sumout_1_=q,sumout_reg_1_.qn=qn) =
61          fd1(sumout_tmp_1_=d, clk=cp);
62      bin_tmp_reg_3_(bin_tmp_3_=q, bin_tmp_reg_3_.qn=qn) = fd1(bin_3_=d,
63          clk=cp);
64      sumout_reg_0_(sumout_0_=q,sumout_reg_0_.qn=qn) =
65      fd1(sumout_tmp_0_=d, clk=cp);
66      bin_tmp_reg_2_(bin_tmp_2_=q,bin_tmp_reg_2_.qn=qn) = fd1(bin_2_=d,
67          clk=cp);
68      bin_tmp_reg_1_(bin_tmp_1_=q,bin_tmp_reg_1_.qn=qn) = fd1(bin_1_=d,
69          clk=cp);
70      cin_tmp_reg(cin_tmp=q, cin_tmp_reg.qn=qn) = fd1(cin=d, clk=cp);
```

```
71      dummy_cell = dummy;
72      bin_tmp_reg_0_(bin_tmp_0_=q,bin_tmp_reg_0_.qn=qn) = fd1(bin_0_=d,
73          clk=cp);
74      add_20_1(n72_1_=sum_4,n72_2_=sum_3,n72_3_=sum_2,n72_4_=sum_1,n72_
75          5_=sum_0) = bitadd_dw01_add_5_0(nc/0/=a_4, ain_tmp_3_=a_3,
76          ain_tmp_2_=a_2, ain_tmp_q59_1_=a_1, ain_tmp_0_=a_0, nc/0/=b_4,
77          bin_tmp_3_=b_3, bin_tmp_2_=b_2, bin_tmp_1_=b_1,
78          bin_tmp_0_=b_0, nc/0/=ci);
79      ain_tmp_reg_0_(ain_tmp_0_=q, ain_tmp_reg_0_.qn=qn) = fd1(ain_0_=d,
80          clk=cp);
81      ain_tmp_reg_1_(ain_tmp_q59_1_=q,ain_tmp_reg_1_.qn=qn) = fd1(ain_1_=d,
82          clk=cp);
83      ain_tmp_reg_2_(ain_tmp_2_=q,ain_tmp_reg_2_.qn=qn) = fd1(ain_2_=d,
84          clk=cp);
85      ain_tmp_reg_3_(ain_tmp_3_=q,ain_tmp_reg_3_.qn=qn) = fd1(ain_3_=d,
86          clk=cp);

87          ain_3_ = (ain_3_);
88          ain_2_ = (ain_2_);
89          ain_1_ = (ain_1_);
90          ain_0_ = (ain_0_);
91          ain_tmp_0_ = (ain_tmp_0_);
92          ain_tmp_q59_1_ = (ain_tmp_q59_1_);
93          ain_tmp_2_ = (ain_tmp_2_);
94          ain_tmp_3_ = (ain_tmp_3_);
95          bin_tmp_0_ = (bin_tmp_0_);
96          bin_0_ = (bin_0_);
97          cin = (cin);
98          bin_tmp_1_ = (bin_tmp_1_);
99          bin_1_ = (bin_1_);
100         bin_tmp_2_ = (bin_tmp_2_);
101         bin_2_ = (bin_2_);
102         sumout_0_ = (sumout_0_);
103         bin_tmp_3_ = (bin_tmp_3_);
104         bin_3_ = (bin_3_);
105         sumout_1_ = (sumout_1_);
106         sumout_2_ = (sumout_2_);
107         sumout_tmp_0_ = (sumout_tmp_0_);
108         sumout_tmp_1_ = (sumout_tmp_1_);
109         sumout_tmp_2_ = (sumout_tmp_2_);
110         cin_tmp = (cin_tmp);
111         n72_5_ = (n72_5_);
112         n72_4_ = (n72_4_);
113         n72_3_ = (n72_3_);
```

```
114         n72_2_ = (n72_2_);
115         n72_1_ = (n72_1_);
116         sumout_3_ = (sumout_3_);
117         sumout_tmp_3_ = (sumout_tmp_3_);
118         carryout = (carryout);
119         clk = (clk);
120         carryout_tmp = (carryout_tmp);
121    end module;

122    module dummy;

123         inputs input1;
124         outputs output1;

125         level function;
126         define

127         /* parts */
128             fd1qa_1()  = fk_arseq(x#-8#11#=d);
129             lclkbuf1a_1(x#-8#11#=z)  = fk_ar_com();

130         /* nets */
131         annotations
132         {
133             bus bus_type = "dot";
134         }

135    end module;

136    end compile;
137    end;
```

What is claimed is:

1. A method of generating a synthesis shell for ASIC design comprising the steps of:
   (a) receiving as input a gate level description netlist of least one block from a behavioral code and ASIC design constraints;
   (b) characterizing inputs and outputs of the at least one block by propagating inputs and outputs from a highest level module to the at least one block;
   (c) excluding at least one cell from the gate level description netlist of the at least one block that is not required to preserve timing information for the at least one block to create a synthesis block;
   (d) generating a synthesis shell netlist from the synthesis block to replace the gate level description netlist of the at least one block;
   (e) subtracting a cell area of the synthesis block from a cell area of the at least one block to generate a cell area difference; and
   (f) including a dummy cell in the synthesis shell netlist having a cell area substantially equal to the cell area difference.

2. The method of claim 1 further comprising, after step (f), the step of (g) recursively iterating steps (b) through (f) for each module at each level to generate a synthesis shell netlist of the highest level module.

3. The method of claim 2 further comprising, after step (h), the steps of (i) restoring load information from each cell excluded in step (d); and (j) including the load information in the synthesis shell netlist.

4. A method of generating a synthesis shell for ASIC design comprising the steps of:
   (a) defining a hierarchy of modules wherein each module has an associated level and comprises at least one block;
   (b) receiving as input a gate level description netlist of the at least one block from a behavioral code and ASIC design constraints;
   (c) characterizing the inputs and outputs of the at least one block by propagating the inputs and outputs from a highest level module to the at least one block;
   (d) excluding each cell from the gate level description netlist of the at least one block that is not required to preserve timing information for the at least one block to create a synthesis block;
   (e) generating a synthesis shell netlist from the synthesis block to replace the gate level description netlist of the at least one block;
   (f) recursively iterating steps (b) through (e) for each module at each level to generate a synthesis shell netlist of the highest level module;
   (g) subtracting a cell area of the synthesis block from a cell area of the at least one block to generate a cell area difference; and
   (h) including a dummy cell in the synthesis shell netlist having a cell area equal to the cell area difference.

5. A machine for generating a synthesis shell for ASIC design comprising a bus, a central processing unit coupled to the bus, input/output devices coupled to the bus, a display coupled to the bus, a data memory coupled to the bus, and an instruction memory coupled to the bus for performing the steps of:
   (a) receiving as input a gate level description netlist of least one block from a behavioral code and ASIC design constraints;
   (b) characterizing inputs and outputs of the at least one block by propagating inputs and outputs from a highest level module to the at least one block;
   (c) excluding at least one cell from the gate level description netlist of the at least one block that is not required to preserve timing information for the at least one block to create a synthesis block;
   (d) generating a synthesis shell netlist from the synthesis block to replace the gate level description netlist of the at least one block;
   (e) subtracting a cell area of the synthesis block from a cell area of the at least one block to generate a cell area difference; and
   (f) including a dummy cell in the synthesis shell netlist having a cell area substantially equal to the cell area difference.

6. The machine of claim 5, further comprising, after step (f), the step of (g) recursively iterating steps (b) through (f) at each level to generate a synthesis shell netlist of the highest level module.

7. The machine of claim 5 wherein step (d) comprises excluding a cell that does not satisfy any of the following criteria:
   the cell lies in a combinatorial path from an input port to a first storage element on the path;
   the cell lies in a combinatorial path from a last storage element to an output port;
   the cell lies in a combinatorial path from an input port to an output port;
   the cell lies in a clock distribution network;
   the cell lies in a feedback path from an output port that is not buffered to a storage element;
   the cell lies in a feedback path that comprise only combinatorial elements; and
   the cell lies in a path used to generate an asynchronous signal.

8. A machine for generating a synthesis shell for ASIC design comprising a bus, a central processing unit coupled to the bus, input/output devices coupled to the bus, a display coupled to the bus, a data memory coupled to the bus, and an instruction memory coupled to the bus for performing the steps of:
   (a) defining a hierarchy of modules wherein each module has an associated level and comprises at least one block;
   (b) receiving as input a gate level description netlist of the at least one block from a behavioral code and ASIC design constraints;
   (c) characterizing inputs and outputs of the at least one block by propagating inputs and outputs from a highest level module to the at least one block;
   (d) excluding at least one cell from the gate level description netlist of the at least one block that is not required to preserve timing information for the at least one block to create a synthesis block;
   (e) generating a synthesis shell netlist from the synthesis block to replace the gate level description netlist of the at least one block;
   (f) recursively iterating steps (b) through (e) at each level to generate a synthesis shell netlist of the highest level module;
   (g) subtracting a cell area of the synthesis block from a cell area of the at least one block to generate a cell area difference; and
   (h) including a dummy cell in the synthesis shell netlist having a cell area equal to the cell area difference.

* * * * *